(12) United States Patent
Bovington et al.

(10) Patent No.: US 11,978,999 B2
(45) Date of Patent: *May 7, 2024

(54) PACKAGE SELF-HEATING USING MULTI-CHANNEL LASER

(71) Applicant: Cisco Technology, Inc., San Jose, CA (US)

(72) Inventors: Jock T. Bovington, Koenigstein im Taunus (DE); Norbert Schlepple, Macungie, PA (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/158,879

(22) Filed: Jan. 24, 2023

(65) Prior Publication Data

US 2023/0163561 A1 May 25, 2023

Related U.S. Application Data

(63) Continuation of application No. 16/995,729, filed on Aug. 17, 2020, now Pat. No. 11,600,964.

(51) Int. Cl.
*H01S 5/024* (2006.01)
*H01S 3/067* (2006.01)
*B23K 101/14* (2006.01)

(52) U.S. Cl.
CPC ...... *H01S 5/02453* (2013.01); *H01S 3/06704* (2013.01); *H01S 5/02469* (2013.01); *B23K 2101/14* (2018.08)

(58) Field of Classification Search
CPC ............ H01S 5/02453; H01S 3/06704; H01S 5/02469; H01S 5/4031; H01S 5/0042; H01S 5/02251; H01S 5/0612; H01S 5/0014; B23K 2101/14
See application file for complete search history.

(56) References Cited

U.S. PATENT DOCUMENTS

| 4,680,810 | A | * | 7/1987 | Swartz | ............... | H01S 5/06808 |
|---|---|---|---|---|---|---|
| | | | | | | 324/762.01 |
| 6,868,104 | B2 | * | 3/2005 | Stewart | ............... | H01S 5/02212 |
| | | | | | | 372/36 |
| 11,600,964 | B2 | * | 3/2023 | Bovington | .......... | H01S 5/02469 |
| 2002/0090011 | A1 | * | 7/2002 | Pezeshki | ............... | H01S 5/4031 |
| | | | | | | 372/20 |

(Continued)

*Primary Examiner* — Xinning(Tom) Niu
(74) *Attorney, Agent, or Firm* — Patterson + Sheridan, LLP

(57) ABSTRACT

Aspects described herein include a method of fabricating an optical component, the optical component, and a method of operating the optical component. A method includes electrically coupling a first laser channel and a second laser channel of a laser die to different electrical leads and testing (i) a first optical coupling of the first laser channel and a second optical coupling of the second laser channel or (ii) a first spectral performance of the first laser channel and a second spectral performance of the second laser channel. The method also includes optically aligning an optical fiber with the first laser channel and designating the second laser channel as a heater element for the first laser channel based at least in part on (i) the first optical coupling being greater than the second optical coupling or (ii) the first spectral performance relative to the second spectral performance.

20 Claims, 6 Drawing Sheets

(56) References Cited

U.S. PATENT DOCUMENTS

| | | | | |
|---|---|---|---|---|
| 2002/0110328 | A1* | 8/2002 | Bischel | G02B 6/4201 385/27 |
| 2003/0152390 | A1* | 8/2003 | Stewart | H04B 10/40 398/22 |
| 2004/0190580 | A1* | 9/2004 | Pezeshki | H01S 5/1246 372/96 |
| 2006/0045147 | A1* | 3/2006 | Sin | H01S 5/0612 372/20 |
| 2008/0198893 | A1* | 8/2008 | Bartoschewski | H01S 5/4025 372/98 |
| 2013/0136403 | A1* | 5/2013 | Yasui | H01S 5/02453 385/88 |
| 2016/0197453 | A1* | 7/2016 | Luo | G01J 1/4257 356/73 |
| 2018/0191130 | A1* | 7/2018 | Liu | H01S 5/125 |

* cited by examiner

PACKAGE SELF-HEATING USING MULTI-CHANNEL LASER

CROSS-REFERENCE TO RELATED APPLICATIONS

This application is a continuation of co-pending U.S. patent application Ser. No. 16/995,729 filed Aug. 17, 2020. The aforementioned related patent application is herein incorporated by reference in its entirety.

TECHNICAL FIELD

Embodiments presented in this disclosure generally relate to optical devices, and more specifically, to techniques for fabricating and operating an optical device capable of self-heating using a multi-channel laser.

BACKGROUND

Optimal performance of semiconductor-based lasers occurs within a limited temperature range. For example, the laser efficiency (e.g., an emitted optical power for an electrical bias power) may be reduced at temperatures above the range, and spectral performance can degrade at temperatures below the range due to the emergence of out-of-band parasitic lasing modes.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate typical embodiments and are therefore not to be considered limiting; other equally effective embodiments are contemplated.

To facilitate understanding, identical reference numerals have been used, where possible, to designate identical elements that are common to the figures. It is contemplated that elements disclosed in one embodiment may be beneficially used in other embodiments without specific recitation.

DESCRIPTION OF EXAMPLE EMBODIMENTS

Overview

Figure 1:
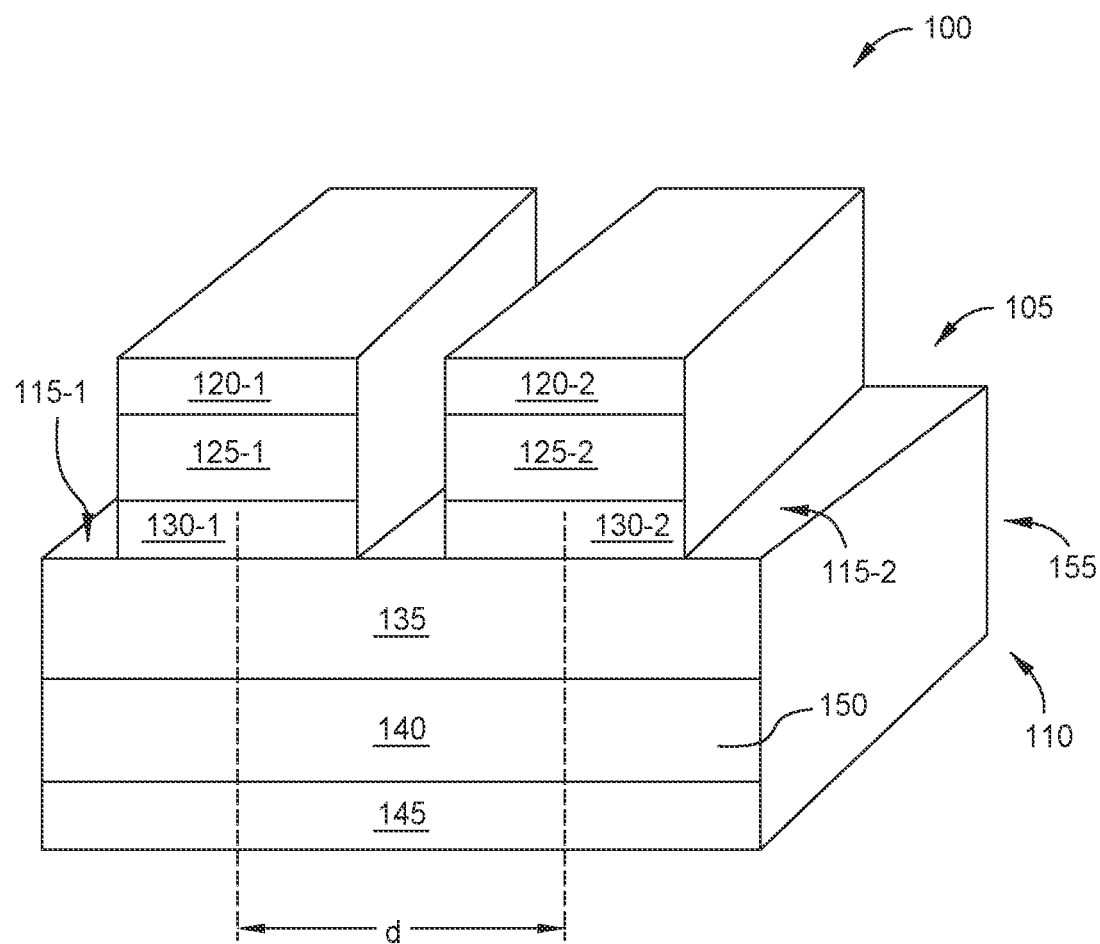
FIG. 1 is a diagram illustrating a perspective view of an exemplary multi-channel laser die, according to one or more embodiments.

One embodiment presented in this disclosure is a method of fabricating an optical component. The method comprises electrically coupling different laser channels of a laser die to different electrical leads, testing a respective optical coupling of each of the different laser channels, optically aligning an optical fiber with a first laser channel of the different laser channels having the greatest optical coupling, and designating a second laser channel of the different laser channels as a heater element for the first laser channel.

Another embodiment presented in this disclosure is an optical component comprising a laser die and a housing component attached to the laser die. Different laser channels of the laser die are electrically coupled to different electrical leads of the housing component. The optical component further comprises an optical fiber that is optically aligned with a first laser channel of the different laser channels. A second laser channel of the different laser channels is designated as a heater element for the first laser channel.

Another embodiment presented in this disclosure is a method comprising transmitting light from a first laser channel of a laser die into an optical fiber, and operating a second laser channel of the laser die as a heater element for the first laser channel.

Example Embodiments

Semiconductor-based lasers such as distributed feedback (DFB) lasers may use a high reflectivity (HR) rear facet and an anti-reflectivity (AR) front facet. The phase of the rear facet is often defined by the cleaving or etching process, which causes a random phase relationship between the light reflected at the rear facet and the grating. In some cases, the random phase can correspond to unsuitably low values of a side mode suppression ratio (SMSR) indicating the presence of substantial parasitics affecting propagation of a modulated signal. These unsuitably low values of SMSR may result in the failure of a substantial percentage of laser dies. To improve the yield of laser dies, multiple laser channels may be formed in each laser die. Thus, even if one laser channel is determined to be faulty or otherwise out-of-spec during the burn-in of the laser die, the other laser channel(s) may still be within spec and the laser die may remain usable.

Optimal performance of semiconductor-based lasers occurs within a limited temperature range. For example, the laser efficiency (e.g., an emitted optical power for an electrical bias power) may be reduced at temperatures above the range, and spectral performance can degrade at temperatures below the range due to the emergence of out-of-band parasitic lasing modes. Techniques used for temperature control for the laser may include a thermo-electric cooler (TEC) combined with a temperature feedback loop (e.g., a thermistor), or alternatively a heater circuitry (e.g., a surface mount technology (SMT) or thin-film resistor) located proximate to the laser die combined with a temperature feedback loop (e.g., a thermistor).

According to embodiments described herein, an optical component comprises a laser die and a housing component attached to the laser die. Different laser channels of the laser die are electrically coupled to different electrical leads of the housing component. The optical component further comprises an optical fiber that is optically aligned with a first laser channel of the laser channels. A second laser channel of the laser channels is designated as a heater element for the first laser channel.

Beneficially, including multiple laser stripes on the laser die provides a redundancy that significantly improves the yield of the laser die. The laser stripes are arranged proximate to each other such that standard packaging techniques may be used. In some embodiments, the multiple laser stripes share a lens and are spaced apart such that optical energy from the first laser channel is coupled into the core of optical fiber while optical energy from the second laser channel (e.g., the heater element) is not coupled into the core. In some embodiments, a greatest optical coupling of the laser channels is determined during testing, and the laser channel having the greatest optical coupling is determined to be the first laser channel.

FIG. 1 is a diagram 100 illustrating a perspective view of an exemplary multi-channel laser die 105, according to one or more embodiments.

The multi-channel laser die 105 (also referred to as a laser die 105) comprises a substrate 110 and a plurality of laser channels 115-1, 115-2. The substrate 110 may be formed of one or more layers of any suitable semiconductor material(s). As shown, the substrate 110 comprises an optical waveguide layer 135 arranged above a cladding layer 140, which is arranged above a conductive contact layer 145. The laser channels 115-1, 115-2 are spaced apart (e.g., a pitch) by a distance d, and respectively include an optically active layer 130-1, 130-2. The multi-channel laser die 105 further comprises a cladding layer 125-1, 125-2 arranged above the optically active layer 130-1, 130-2, and a conductive contact layer 120-1, 120-2 arranged above the cladding layer 125-1, 125-2.

In one example, the cladding layers 140, 125-1, 125-2 comprise an indium phosphide (InP) semiconductor material, and the optical waveguide layer 135 may be formed of gallium indium arsenide phosphide (GaInAsP), aluminum gallium indium arsenide (AlGaInAs), or another suitable quaternary compound semiconductor material. In another example, the cladding layers 140, 125-1, 125-2 comprise an aluminum gallium arsenide (AlGaAs) semiconductor material, and the optical waveguide layer 135 may be formed of gallium arsenide (GaAs), AlGaAs with a lower proportion of aluminum, and so forth. The optically active layer 130-1, 130-2 may comprise regions of any suitable optically active material(s), such as quantum wells, quantum dots, and quantum wires. Further, the optically active material(s) may be electrically pumped and/or optically pumped.

The multi-channel laser die 105 comprises a front facet 150 having an anti-reflectivity film or coating, and a rear facet 155 having a high-reflectivity film or coating. Each of the laser channels 115-1, 115-2 extends between the front facet 150 and the rear facet 155.

In some embodiments, the laser channels 115-1, 115-2 have a same phase at the rear facet 155. In other embodiments, the laser channels 115-1, 115-2 have a predetermined phase difference at the rear facet 155 to decorrelate any deleterious phases of the laser channels 115-1, 115-2.

In general, yielding of the multi-channel laser die 105 requires only one of the laser channels 115-1, 115-2 to be functional. Assuming that both laser channels 115-1, 115-2 are functional, the "non-preferred" laser channel 115-1, 115-2 (e.g., having a lesser optical coupling and/or having degraded spectral performance and/or showing signs of early failure (burn-in fail)) may be designated and operated as the heater element for the "preferred" laser channel 115-1, 115-2 that is operated as the laser element. The heater element may be operated to raise the operating temperature of the laser and extend the operational range of the laser element. Further, using one of the laser channels 115-1, 115-2 as the heater element provides a simpler implementation as additional components such as a TEC are not required.

Figure 2:
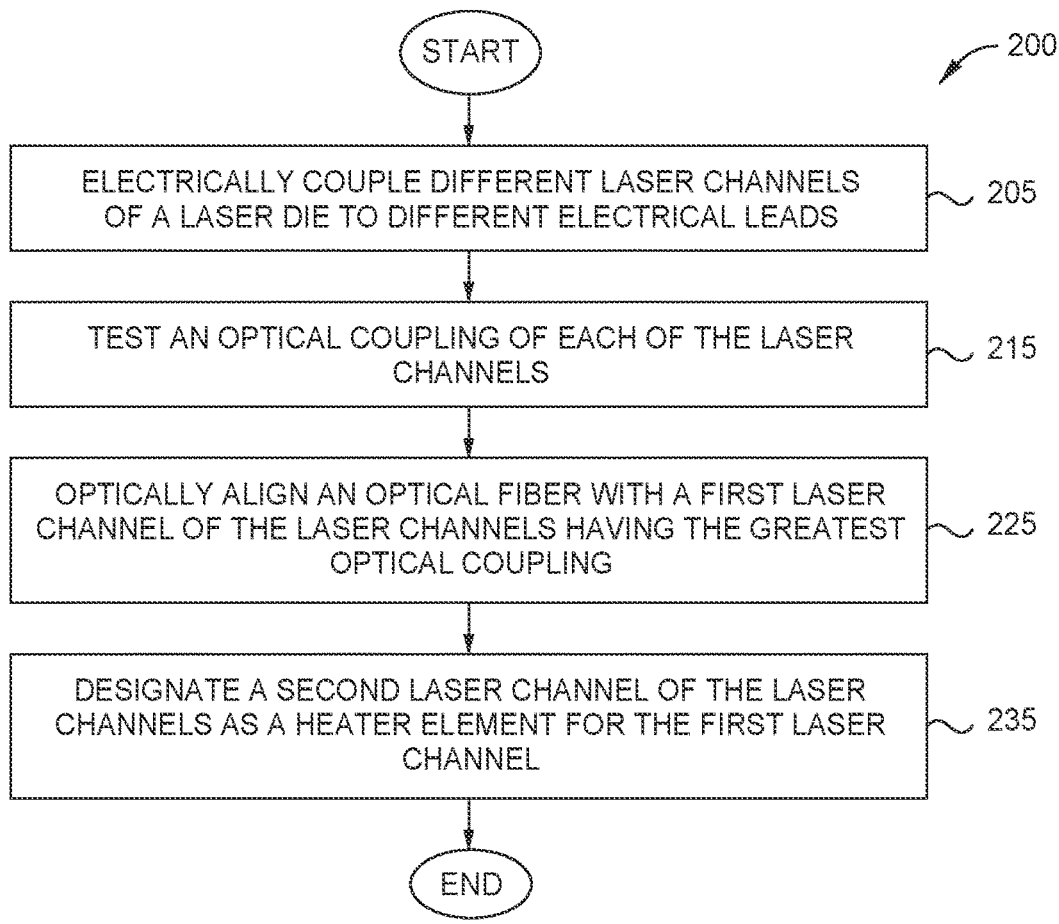
FIG. 2 is an exemplary method of fabricating an optical apparatus, according to one or more embodiments.

FIG. 2 is an exemplary method 200 of fabricating an optical apparatus, according to one or more embodiments. The method 200 may be used in conjunction with other embodiments, such as the multi-channel laser die 105 of FIG. 1.

The method 200 begins at block 205, where different channels of the laser die are electrically coupled to different electrical leads. The electrical leads may be included in a package for the optical apparatus. In some embodiments, a header of the package comprises the electrical leads, and electrically coupling the different channels to different electrical leads comprises attaching the laser die to the header. In some embodiments, the different channels of the laser die may be electrically coupled to a same electrical lead (e.g., a common cathode that is shared by the different channels) so long as each channel is also electrically coupled with different electrical leads (e.g., each of the different channels is electrically coupled with a different anode).

At block 215, an optical coupling of each of the laser channels is tested. In some embodiments, testing the respective optical coupling is performed using a monitor photodiode (e.g., a large area monitor photodiode) shared by the laser channels. In some embodiments, the monitor photodiode is included in the package (e.g., included in the header).

In other embodiments, the monitor photodiode may external to the packaging of the optical component. In some embodiments, testing the respective optical coupling includes disposing a lens between the laser die and the monitor photodiode. For example, the method 200 may further comprise contacting a cap of the package to the header, where the lens is arranged at an opening of the cap.

At block 225, an optical fiber is optically aligned with a first laser channel of the laser channels having the greatest optical coupling. In some embodiments, optically aligning the optical fiber comprises moving the cap relative to the header. In this way, optically aligning the optical fiber is performed through the lens. The method may further comprise rigidly attaching the cap to the header.

In some embodiments, optically aligning the optical fiber comprises arranging the optical fiber at a first distance from the lens. The first distance is based on a magnification of the lens and is selected to match a mode size of the laser channels to a mode size of the optical fiber.

At block 235, a second laser channel of the laser channels is designated as a heater element for the first laser channel. The method 200 ends following completion of block 235.

Figure 3:
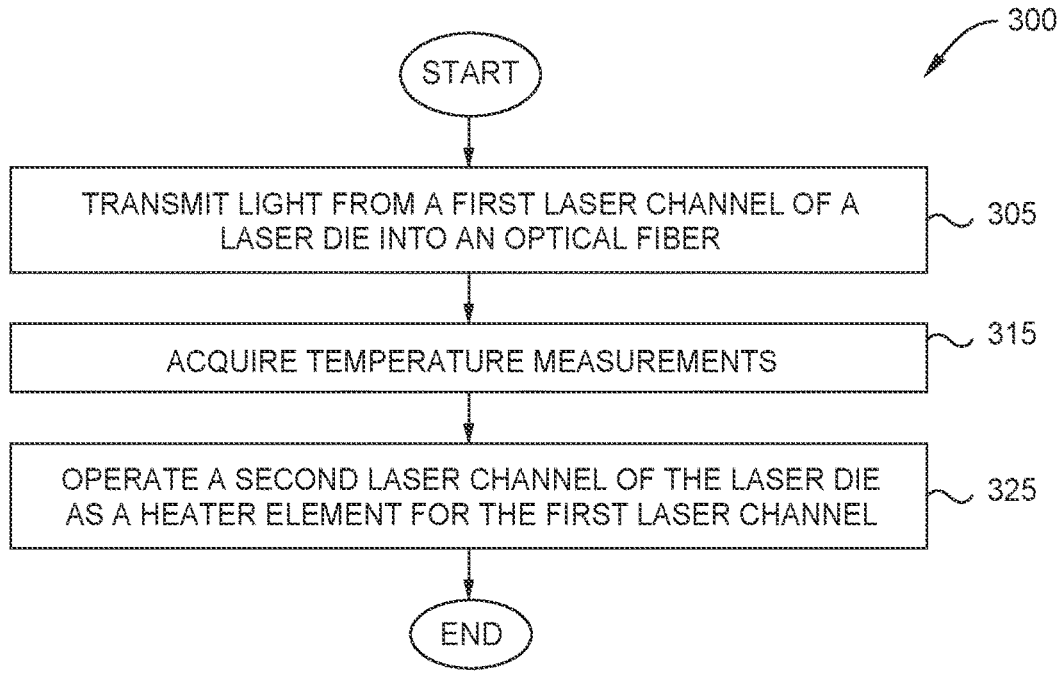
FIG. 3 is an exemplary method of operating an optical apparatus, according to one or more embodiments.

FIG. 3 is an exemplary method 300 of operating an optical apparatus, according to one or more embodiments. The method 300 may be used in conjunction with other embodiments, such as operating the optical apparatus formed using the method 200 of FIG. 2.

The method 300 begins at block 305, where light is transmitted from a first laser channel of a laser die into an optical fiber. In some embodiments, the light is transmitted through a lens into a core of the optical fiber. At block 315, temperature measurements are acquired. In some embodiments, the temperature measurements are acquired using a thermistor coupled with the laser die. In some embodiments, the laser die is arranged within a package, and the temperature measurements are acquired external to the package.

At block 325, a second laser channel of the laser die is operated as a heater element for the first laser channel. In some embodiments, the second laser channel is operated based on the temperature measurements. In some embodiments, the light from the second laser channel is transmitted through the lens and is not coupled into the core. For example, the spacing between the laser die, the lens, and the optical fiber may be determined such that the light from the second laser channel is offset from the light from the first laser channel by a predetermined amount at the optical fiber (e.g., several microns) to minimize coupling from the second laser channel into the core. The spacing may further be based on a pitch between the first laser channel and the second laser channel and a magnification of the lens. The method 300 ends following completion of block 325.

FIGS. 4A-4F illustrate an exemplary sequence of fabricating an optical apparatus, according to one or more embodiments. The sequence illustrated in FIGS. 4A-4E may be used in conjunction with other embodiments, e.g., one possible implementation of the method 200 of FIG. 2.

Figure 4A:
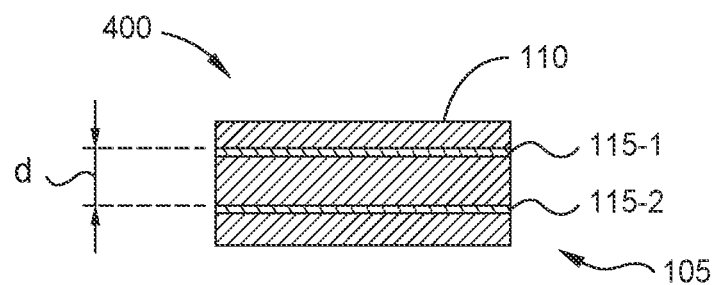
FIGS. 4A-4F illustrate an exemplary sequence of fabricating an optical apparatus, according to one or more embodiments.

Diagram 400 of FIG. 4A represents a top view of the multi-channel laser die 105. The laser channels 115-1, 115-2 are disposed on a substrate 110. The laser channels 115-1, 115-2 extend parallel to each other and are spaced apart (e.g., a pitch) by a distance d. The diagram 400 thus represents a pre-bond chip or bar testing stage for the multi-channel laser die 105.

Figure 4B:
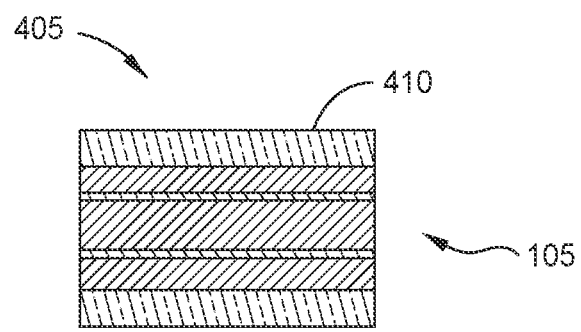

In FIG. 4B, the multi-channel laser die 105 is bonded with a substrate 410 to form an assembly 405. FIG. 4B thus represents die bonding, testing, and/or burn-in stages for the multi-channel laser die 105.

Figure 4C:
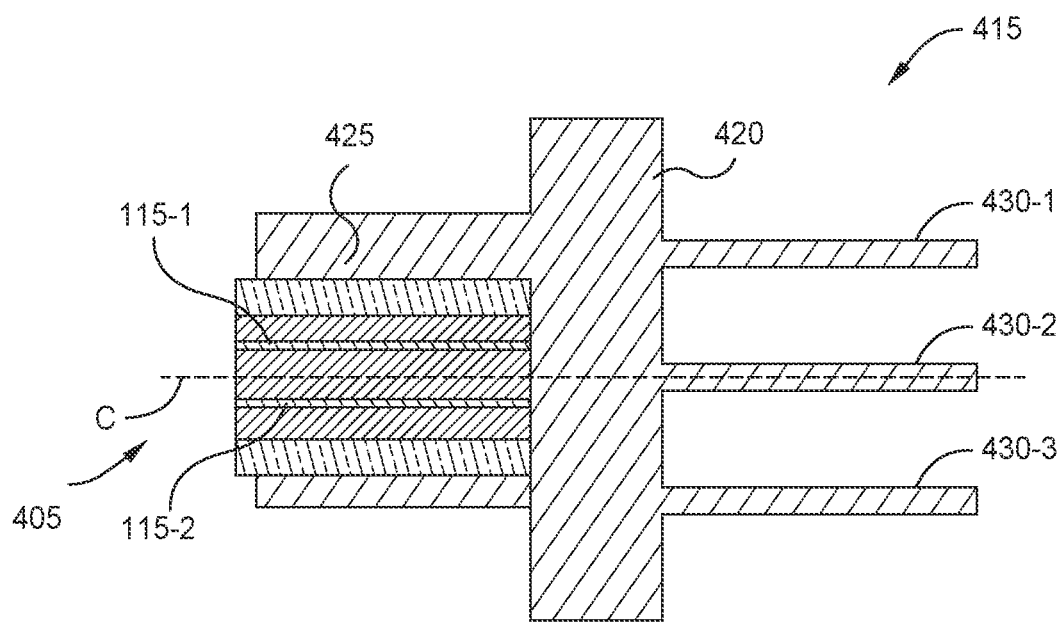
Figure 4D:
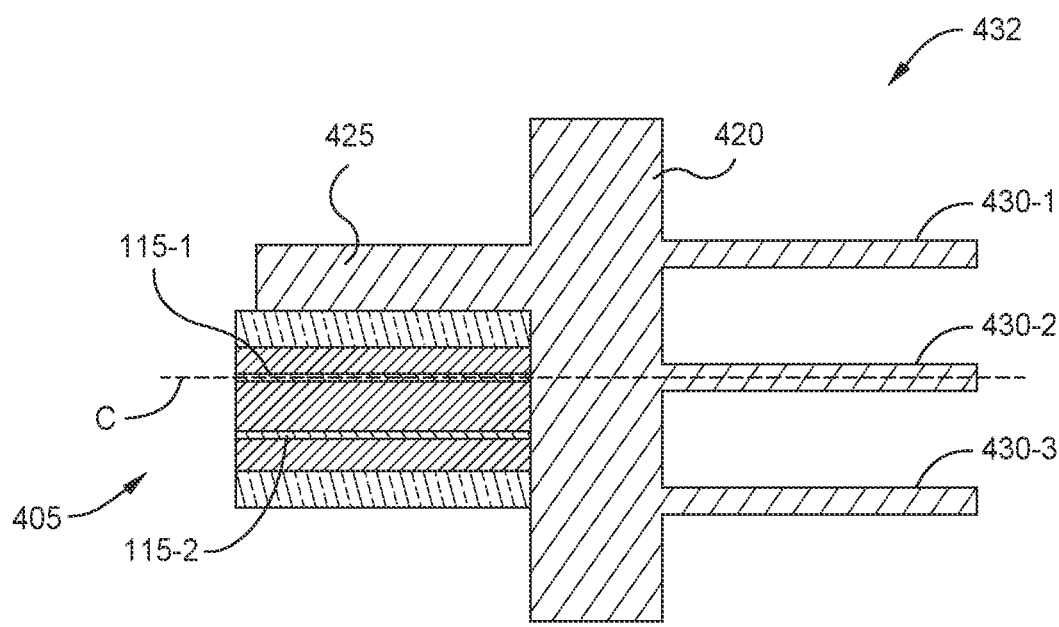

In FIGS. 4C and 4D, the assembly 405 is attached to a submount 425 of a header 420 to respective form an assembly 415, 432. The header 420 may be formed of any suitable material, such as a metal. The header 420 further comprises a plurality of electrical leads 430-1, 430-2, 430-3. In some embodiments, the electrical lead 430-1 is an anode for the laser channel 115-1, the electrical lead 430-3 is an anode for the laser channel 115-2, and the electrical lead 430-2 is a common cathode for the laser channels 115-1, 115-2. In other embodiments, the laser channels 115-1, 115-2 may be electrically coupled to different cathodes.

In some embodiments, testing is performed on the multi-channel laser die 105 to determine the optical and spectral performance and reliability of each of the laser channels 115-1, 115-2. For example, a large area monitor photodiode may be shared by the laser channels 115-1, 115-2. In some embodiments, the testing is performed prior to attaching the assembly 405 to the submount 425. In other embodiments, the testing is performed after attaching the assembly 405 to the submount 425.

In some embodiments, a first laser channel 115-1 having the showing the superior performance is designated as the laser element of the assembly 405, and a second laser channel 115-2 is designated as the heater element for the laser channel 115-1. In some embodiments, and as shown in FIG. 4D, attaching the assembly 405 to the submount 425 comprises aligning the first laser channel 115-1 with a center axis C of the header 420, which in some cases corresponds to an optical axis of the optical apparatus. This may occur in cases where the multi-channel laser die 105 has been tested and burned-in prior to its attachment to the header 420. In other embodiments, the optical axis of the optical apparatus may not correspond to the center axis C, and the first laser channel 115-1 is aligned with the optical axis.

In some embodiments, and as shown in FIG. 4C, the first laser channel 115-1 and the second laser channel 115-2 are offset from a center axis C of the header 420 (which in some cases corresponds to an optical axis of a lens of the optical apparatus). However, the offset distances of the laser channels 115-1, 115-2 from the center axis C are relatively small when compared with the distances between the laser die and the lens, and between the optical fiber and the lens, such that the offset distances contributes only negligible aberration without degrading optical coupling, when compared with an on-axis optical system. This may occur in cases where the multi-channel laser die 105 is tested and burned-in after its attachment to the header 420 (e.g., for a Transistor Outline (TO) header).

Figure 4E:
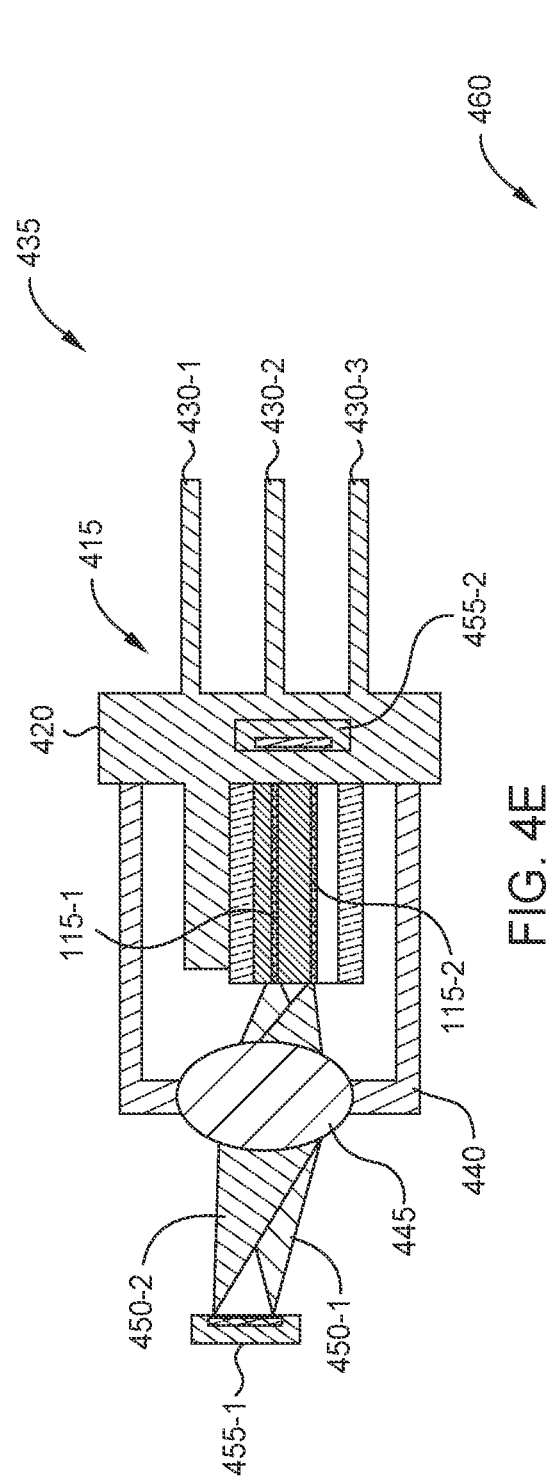

In FIG. 4E, a cap 440 of the package is contacted to the header 420 to form an assembly 435, where the laser die is arranged in an interior space formed by the cap 440 and the header 420. The cap 440 may be formed of any suitable material, such as a metal. A lens 445 is arranged at an opening of the cap 440. In some embodiments, the lens 445 may have a positive magnification that images the mode size of the optical signals exiting the laser die onto the mode size of the core of the optical fiber. By translating the cap 440 relative to the header 420, the lens 445 may be aligned to the first laser channel 115-1 in two spatial dimensions. Once the lens 445 is aligned to the facet, the cap 440 may be rigidly attached to the header 420 (e.g., through welding).

In some embodiments, the testing is performed on the multi-channel laser die 105 through the lens 445. In these embodiments, a large area monitor photodiode 455-1 is external to the packaging of the optical component and is shared by the laser channels 115-1, 115-2. In other words, optical energy from the laser channels 115-1, 115-2 is directed through the lens 445 onto the large area monitor photodiode 455-1. In other embodiments, a large area monitor photodiode 455-2 is included in the package (e.g., included in the header 420) and is shared by the laser channels 115-1, 115-2.

Figure 4F:
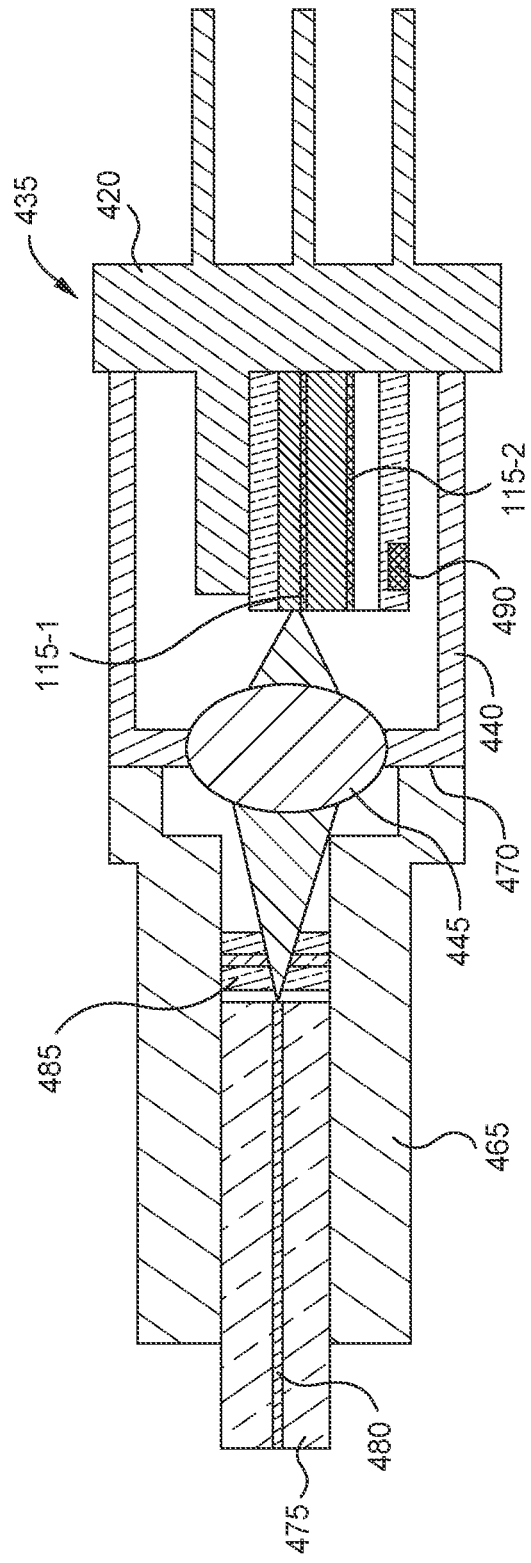

In FIG. 4F, an optical connector 465 is contacted to the cap 440 at an interface 470 to form an assembly 460. The optical connector 465 may have any suitable implementation, such as a fiber pigtail or a receptacle. An optical fiber 480 is rigidly attached to the optical connector 465. In some embodiments, a ferrule 475 surrounds the optical fiber 480 and ensures alignment of the optical fiber 480 during connector mating. The ferrule 475 may be formed of any material having suitable rigidity, such as ceramic, stainless steel, plastic, or tungsten carbide. The ferrule 475 and the optical fiber 480 may be rigidly attached to each other using any suitable techniques, such as adhesive or crimping. In some cases, an end of the ferrule 475 may be polished after rigidly attaching the optical fiber 480, e.g., to provide an improved optical interface.

The ferrule 475 and the optical fiber 480 are inserted into an interior space of the optical connector 465 and are retained by the optical connector 465 using any suitable means, such as an adhesive, a friction fit, and so forth. In some embodiments, an optical isolator 485 is arranged in the interior space and is aligned with the optical fiber 480 when inserted. By translating the optical connector 465 relative to the cap 440, the optical fiber 480 may be aligned, through the optical isolator 485 and the lens 445, to the first laser channel 115-1 in three spatial dimensions. Once the optical fiber 480 is aligned to the first laser channel 115-1, the optical connector 465 may be rigidly attached to the cap 440 (e.g., through welding). In this way, aligning the optical fiber 480 to the laser die comprises attaching the optical connector 465 with a housing component (e.g., attached with the header 420 through the cap 440).

In some embodiments, operating the second laser channel 115-2 is based on temperature measurements acquired using a thermistor 490 coupled with the multi-channel laser die 105. The thermistor 490 supports an active feedback loop for operating the second laser channel 115-2 as the heater element.

In other embodiments, operating the second laser channel 115-2 is based on temperature measurements acquired external to the package (e.g., external to the assembly 460). During calibration, the performance of the laser element (i.e., the first laser channel 115-1) may be determined relative to the current delivered to the second laser channel 115-2 and the temperature measurements. The calibration data may be stored in memory (e.g., in a look-up table), and during operation the current delivered to the second laser channel 115-2 may be selected based on the temperature measurements to achieve optimal performance of the first laser channel 115-1.

Figure 5:
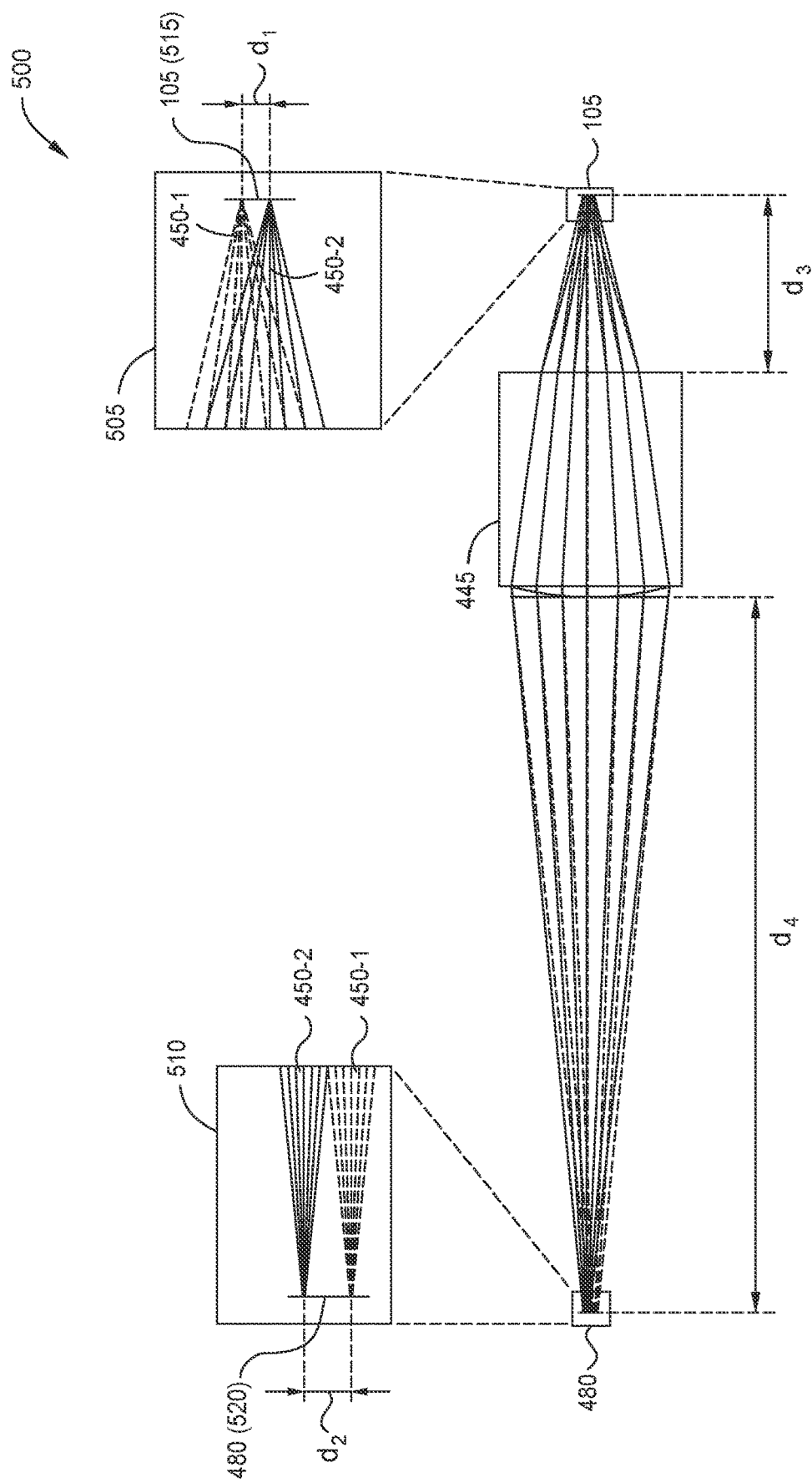
FIG. 5 is a diagram illustrating exemplary alignment of an optical fiber, a lens, and a multi-channel laser die, according to one or more embodiments.

FIG. 5 is a diagram 500 illustrating exemplary alignment of an optical fiber, a lens, and a multi-channel laser die, according to one or more embodiments. The features illustrated in the diagram 500 may be used in conjunction with other embodiments. For example, diagram 500 represents one possible implementation of the optical apparatus shown in FIG. 4E.

In the diagram 500, an inset portion 505 shows optical signals 450-1, 450-2 exiting the laser channels 115-1, 115-2 at a facet 515 of the laser die 105. The optical signals 450-1, 450-2 are incident on the lens 445 and directed toward an endface 520 of the optical fiber 480. An inset portion 510 shows the optical signals 450-1, 450-2 being received at the endface 520. Although not shown here, an optical isolator may be arranged between the lens 445 and the endface 520.

The optical signals 450-1, 450-2 exit along a length of the facet 515 having a distance d1, and the optical signals 450-1, 450-2 are received along a length of the endface 520 having a distance d2. In some embodiments, the endface 520 of the optical fiber 480 and the facet 515 of the laser die 105 are parallel, and adjacent ones of the optical signals 450-1, 450-2 are equidistant at the endface 520 and at the facet 515.

The lens 445 provides a given magnification imaging the mode size of the optical signals 450-1, 450-2 exiting the facet 515 of the laser die 105 onto the mode size of the core at the endface 520. In some embodiments, the magnification of the lens 445 is positive.

The magnification of the lens 445 also affects the spacing between the optical signals 450-1, 450-2 at the endface 520. In some embodiments, the spacing between the optical signals 450-1, 450-2 (i.e., the distance d2) is greater than about 10 microns to minimize cross-talk from the optical signal 450-2 onto the optical signal 450-1 received at the core of the optical fiber 480. For example, the spacing between the laser channels 115-1, 115-2 (i.e., the distance d1) may be between about 20 microns and about 70 microns, and the distance d2 may be between about 50 microns and 150 microns. Other values and ratios of the distances d1, d2 are also contemplated.

The size of the lens 445, the spacing between the lens 445 and the optical fiber 480, and the spacing between the lens 445 and the facet 515 may be selected based on the distances d1, d2. In some embodiments, aligning the optical fiber 480 to the laser die 105 through the lens 445 comprises arranging the optical fiber 480 at a distance d4 from the lens 445. The distance d4 is based on a magnification of the lens 445 and is selected to (i) match a mode size of the laser channels 115-1, 115-2 to a mode size of the core of the optical fiber 480.

In some embodiments, the distance d4 between the lens 445 and the optical fiber 480 (i.e., the endface 520) is between about two (2) times and about five (5) times a distance d3 between the lens 445 and the facet 515. In one non-limiting example, the distance d4 is about 3000 microns, and the second distance is about 1000 microns. For this combination of distances d3, d4, a relatively large aperture of the lens 445 is capable of supporting the multiple channels. When compared with the distances d3, d4, the relatively small offset of the optical signals 450-1, 450-2 from an optical axis of the lens 445 contributes only negligible aberration without degrading optical coupling, when compared with an on-axis optical system.

Various techniques have been described for fabricating and operating an optical device capable of self-heating using a multi-channel laser. In some embodiments, prior to optical alignment of a laser die with an optical fiber, the laser die may be bonded to a submount and packaged onto a TO header. In some embodiments, each of the laser channels is tested to identify a superior laser channel to operate as the laser element. With the multiple laser channels, the partially-packaged assemblies may be divided into four (4) bins, of which only a single bin is yielded out when both laser channels fail burn-in, electrical, power, and spectral screening. The other laser channel may be operated as a heating element inside the laser die, and provides greater efficiency due to its proximity to the laser element, provides an extended power handling capability of the laser, and reduces component costs (e.g., not requiring an external heater or a TEC).

The multiple laser channels are arranged in proximity to each other, such that the laser may be implemented within a same mechanical package as a single-channel package. The optical alignment of an optical fiber to a selected laser channel may be performed without design modifications, as the required optical fiber offset for either laser channel falls within standard assembly tolerances.

Regardless of which laser channel is selected, the design of the optical apparatus may remain the same, as the offset of the laser channels from the optical axis of a lens may be relatively small when compared with the distances between the laser die and the lens, and between the optical fiber and the lens, such that the offset distances contributes only negligible aberration without degrading optical coupling, when compared with an on-axis optical system.

During the fabrication process, the individual laser channels may be toggled independently for testing, and both laser channels may use a same large area monitor photodiode. Once the designation of the laser channels as the laser element and the heater element is completed, optical alignment may occur with the laser element turned on and the heater element turned off. Other than testing of the individual laser channels, the fabrication of the optical apparatus may be completed without significant changes to the process flow, equipment, or test plan.

Despite the laser channels sharing a same coupling lens, the laser channel designated as the heater element will not couple light into the optical fiber so long as the laser channel is separated at least several microns from the laser channel designated as the laser element. In some embodiments, the light from the heater element is focused outside the main package cavity (e.g., beyond an optical isolator) such that no stray light is expected within the main package cavity, which could interfere with operation of the laser element.

In the preceding, reference is made to embodiments presented in this disclosure. However, the scope of the present disclosure is not limited to specific described embodiments. Instead, any combination of the described features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the preceding aspects, features, embodiments and advantages are merely illustrative and are not considered elements or limitations of the appended claims except where explicitly recited in a claim(s).

Aspects of the present disclosure are described with reference to flowchart illustrations and/or block diagrams of methods, apparatus (systems) and computer program products according to embodiments presented in this disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality and operation of possible implementations of systems, methods and computer program products according to various embodiments. In this regard, each block in the flowchart or block diagrams may represent a module, segment or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

In view of the foregoing, the scope of the present disclosure is determined by the claims that follow.

We claim:

1. A method of fabricating an optical component, the method comprising:
   electrically coupling a first laser channel and a second laser channel of a laser die to different electrical leads;
   testing (i) a first optical coupling of the first laser channel and a second optical coupling of the second laser channel or (ii) a first spectral performance of the first laser channel and a second spectral performance of the second laser channel;
   optically aligning an optical fiber with the first laser channel based at least in part on (i) the first optical coupling being greater than the second optical coupling or (ii) the first spectral performance relative to the second spectral performance; and
   designating, based at least in part on (i) the first optical coupling being greater than the second optical coupling or (ii) the first spectral performance relative to the second spectral performance, the second laser channel as a heater element for the first laser channel such that the second laser channel remains optically misaligned or unaligned with the optical fiber and the first laser channel remains optically aligned with the optical fiber.

2. The method of claim 1, wherein electrically coupling the first and second laser channels comprises attaching the laser die to a header of a package for the optical component, wherein the header comprises the different electrical leads.

3. The method of claim 2, further comprising contacting a cap of the package to the header, wherein a lens is arranged at an opening of the cap, and wherein optically aligning the optical fiber is performed through the lens.

4. The method of claim 3, wherein optically aligning the optical fiber comprises moving the cap relative to the header, the method further comprising rigidly attaching the cap to the header.

5. The method of claim 3, wherein optically aligning the optical fiber comprises arranging the optical fiber at a first distance from the lens, wherein the first distance is based on a magnification of the lens and is selected to match a mode size of the first and second laser channels to a mode size of the optical fiber.

6. The method of claim 1, wherein testing the first optical coupling is performed using a monitor photodiode shared by the first and second laser channels.

7. The method of claim 6, wherein the monitor photodiode is included in a header of a package for the optical component.

8. The method of claim 6, wherein the monitor photodiode is external to packaging of the optical component.

9. An optical component, comprising:
   a laser die;
   a housing component attached to the laser die, wherein a first laser channel and a second laser channel of the laser die are electrically coupled to different electrical leads of the housing component; and
   an optical fiber that is optically aligned with the first laser channel based at least in part on (i) a first optical coupling of the first laser channel being greater than a second optical coupling of the second laser channel or (ii) a first spectral performance of the first laser channel relative to a second spectral performance of the second laser channel, wherein the second laser channel is designated, based at least in part on (i) the first optical coupling being greater than the second optical coupling or (ii) the first spectral performance relative to the second spectral performance, as a heater element for the first laser channel such that the second laser channel remains optically misaligned or unaligned with the optical fiber and the first laser channel remains optically aligned with the optical fiber.

10. The optical component of claim 9, wherein the housing component is a first housing component, the optical component further comprising:

a second housing component contacted to the first housing component; and a lens arranged at an opening of the second housing component, wherein the optical fiber is optically aligned through the lens.

11. The optical component of claim 10, wherein the optical fiber is arranged at a first distance from the lens that is based on a magnification of the lens and that is selected to match a mode size of the first and second laser channels to a mode size of the optical fiber.

12. The optical component of claim 9, further comprising a monitor photodiode shared by the first and second laser channels.

13. The optical component of claim 12, wherein the monitor photodiode is included in the housing component.

14. A method comprising:
transmitting light from a first laser channel of a laser die into an optical fiber; and
operating, based at least in part on (i) a first optical coupling of the first laser channel being greater than a second optical coupling of a second laser channel of the laser die or (ii) a first spectral performance of the first laser channel relative to a second spectral performance of the second laser channel, the second laser channel as a heater element for the first laser channel such that the second laser channel remains optically misaligned or unaligned with the optical fiber and the first laser channel remains optically aligned with the optical fiber.

15. The method of claim 14, wherein the first laser channel is selected as having a greater optical coupling during testing than the second laser channel.

16. The method of claim 15, wherein the testing is performed using a monitor photodiode shared by the first laser channel and the second laser channel.

17. The method of claim 16, wherein the laser die is attached to a header of a package, and wherein the monitor photodiode is included in the header.

18. The method of claim 14, wherein operating the second laser channel is based on temperature measurements acquired using a thermistor coupled with the laser die.

19. The method of claim 14, wherein the laser die is arranged within a package, and wherein operating the second laser channel is based on temperature measurements acquired external to the package.

20. The method of claim 14, wherein the laser die is attached to a header of a package, wherein the header comprises electrical leads, and wherein the first laser channel and the second laser channel are electrically coupled to different electrical leads.

* * * * *